(12) United States Patent
Zeleznik et al.

(10) Patent No.: US 10,295,576 B2
(45) Date of Patent: May 21, 2019

(54) RATIOMETRIC BIASING FOR HIGH IMPEDANCE CAPACITIVE SENSING

(71) Applicant: Robert Bosch GmbH, Stuttgart (DE)

(72) Inventors: Matthew A. Zeleznik, Pittsburgh, PA (US); Anthony T. Zisko, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/873,809

(22) Filed: Jan. 17, 2018

(65) Prior Publication Data

US 2019/0033348 A1    Jan. 31, 2019

Related U.S. Application Data

(60) Provisional application No. 62/537,239, filed on Jul. 26, 2017.

(51) Int. Cl.
*H03F 3/345* (2006.01)
*G01R 19/00* (2006.01)
*G01D 5/24* (2006.01)
*H03F 1/26* (2006.01)

(52) U.S. Cl.
CPC .......... *G01R 19/0092* (2013.01); *G01D 5/24* (2013.01); *H03F 1/26* (2013.01); *H03F 3/345* (2013.01)

(58) Field of Classification Search
CPC ..... G01R 19/0092; H03F 3/345; H03F 3/181; H03F 2200/126; H03F 1/26; H03F 2200/165; G01D 5/24
See application file for complete search history.

(56) References Cited

U.S. PATENT DOCUMENTS 9,634,628 B2 * 4/2017 Nicollini ............ H03F 3/45076
9,948,250 B2 * 4/2018 Frohlich .................. H03F 1/34

* cited by examiner

*Primary Examiner* — Jung Kim
(74) *Attorney, Agent, or Firm* — Maginot Moore & Beck LLP

(57) ABSTRACT

A biasing circuit for a capacitive sensor includes a capacitive sensor element configured to produce a sensor voltage at a sense node, and a preamplifier connected to the sense node and configured to amplify the sensor voltage. The biasing circuit has an auxiliary amplifier connected between an output of the preamplifier and the sense node and configured to set a DC component of an input voltage for the preamplifier to a ratiometric DC bias voltage.

10 Claims, 6 Drawing Sheets

RATIOMETRIC BIASING FOR HIGH IMPEDANCE CAPACITIVE SENSING

CROSS-REFERENCE TO RELATED APPLICATIONS

This application claims priority to U.S. Provisional Application Ser. No. 62/537,239 entitled " RATIOMETRIC BIASING FOR HIGH IMPEDANCE CAPACITIVE SENSING" by Zeleznick et al., filed Jul. 26, 2017, the disclosure of which is hereby incorporated herein by reference in its entirety.

TECHNICAL FIELD

The device and method disclosed in this document relates to capacitive sensing and, more particularly, to ratiometric biasing for high impedance capacitive sensing.

BACKGROUND

The headroom above and below an amplifier's DC output voltage determines the magnitude of the signal swing that the amplifier can produce before the amplifier output distorts an input signal. For a capacitive sensor which mates to a preamplifier, prior art circuits use a high impedance (high-z) diode network at the sensor interface to conserve the charge stored on the sensor. This high-z network also sets the DC voltage level at the amplifier input, which is commonly set to circuit ground. In turn, there are internal voltages within the preamplifier which will be referenced to the input DC level, possibly also including the output voltage based on the chosen architecture. As the positive power supply increases, these nodes will not follow with it, which can generate an asymmetry in the available signal headroom within the amplifier, which can cause distortions in the preamplifier output. Consequently, improvements to amplified capacitive sensor systems that reduce distortion in amplifier output would be beneficial.

SUMMARY

A biasing circuit for a capacitive sensor is disclosed. The biasing circuit comprises: a capacitive sensor element configured to produce a sensor voltage at a sense node, a preamplifier connected to the sense node and configured to amplify the sensor voltage; an auxiliary amplifier connected between the output of the preamplifier and the sense node and configured to set a DC component of the output of the preamplifier to a ratiometric DC bias voltage.

In one embodiment, the preamplifier is comprised of one or more stages, which are used to buffer or amplify an input signal.

In one embodiment, the auxiliary amplifier is used to generate a ratiometric DC bias condition for the input of the preamplifier.

In one embodiment, the biasing circuit further includes a high impedance diode network configured to generate a high impedance DC bias for the preamplifier.

In one embodiment, the biasing circuit further includes a divider circuit which generates a division of the power supply, used by the auxiliary amplifier as a reference point for generating a DC bias at the input of the preamplifier.

In one embodiment, the biasing circuit further includes an optional second auxiliary amplifier that generates a static offset based off of the divided down power supply from the divider circuit.

In one embodiment, the biasing circuit further includes an optional ratiometric bias voltage for the capacitive sensor element.

In one embodiment, the preamplifier generates an output voltage which is directly level shifted based on its input voltage.

In one embodiment, the preamplifier has internal node voltages which are directly level shifted based on its input voltage.

In one embodiment, the preamplifier accepts a range of input common mode levels and correspondingly shifts its output common mode and other internal node voltages based on the input common mode level.

In one embodiment, the diode network accepts a range of DC bias levels and generates a high impedance input for the preamplifier and capacitive sensor element at the same DC bias level.

In one embodiment, the diode network presents a high impedance to the capacitive sensor element to enable the capacitive sensor element to produce an input signal for the preamplifier.

In one embodiment, the auxiliary amplifier is placed in a feedback loop to maintain the output voltage of the amplifier at the same level as the divided supply voltage, without interfering with the input signal from the transducer.

In one embodiment, the divider circuit generates a fraction of the voltage given by the two power supply rails to use as a reference voltage for generating a ratiometric output.

In one embodiment, the ratiometric bias voltage for the capacitive sensor element tracks with the DC level at the high impedance amplifier input, such that the voltage across the capacitive sensor is constant through the supply range.

In one embodiment, an optional additional feedback loop containing the second auxiliary amplifier is used to provide a static offset to a divided supply voltage.

In one embodiment, a ratiometric biasing for a high impedance capacitive sensor is used in a single ended capacitive sensor input or a differential capacitive input.

BRIEF DESCRIPTION OF THE DRAWINGS

The foregoing aspects and other features of a ratiometric biasing circuit are explained in the following description, taken in connection with the accompanying drawings.

DETAILED DESCRIPTION

Figure 1:
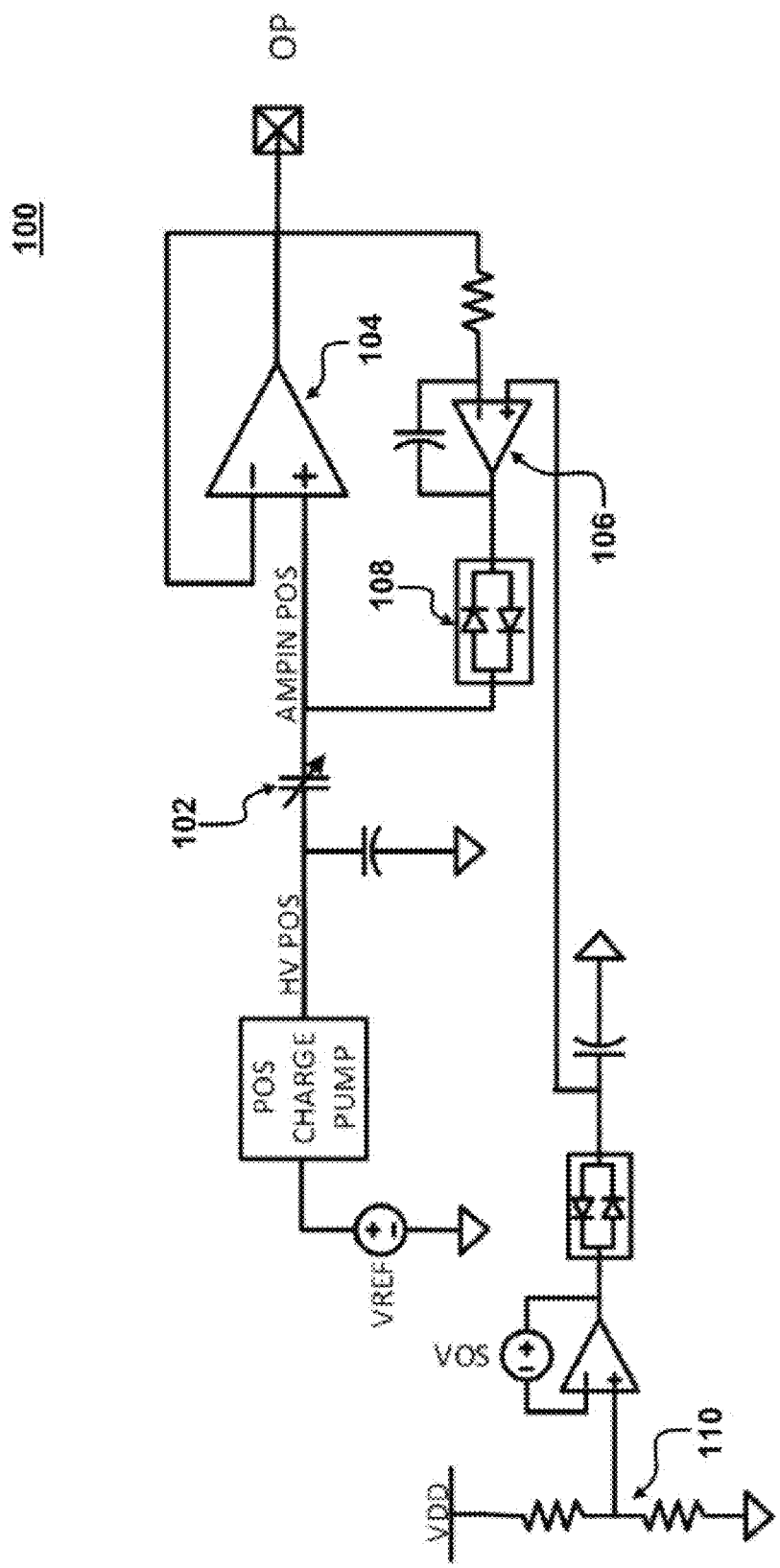
FIG. 1 shows a single ended ratiometric biasing circuit for a capacitive sensor.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

The disclosure is directed to a biasing scheme that maximizes the available headroom (i.e., swing range) for the amplifier of a biasing circuit which interfaces to the capacitive sensor, such as a biasing circuit for a MEMS microphone. The biasing scheme enables the bias level to be set such that a common mode output of the amplifier is at the midpoint of the voltages provided by the two power supply rails to the circuit. This enables the amplifier output to swing equally above and below the common mode output voltage. The biasing can be applied through the high impedance network that is connected to both the sensor and the amplifier input. This configuration has distinct advantage over fixed input bias amplifier-sensor interfaces which are known in the art in that it allows the circuit to scale certain voltage levels inside the amplifier with VDD instead of being always referenced to ground or some other fixed reference voltage. This can free up a large amount of headroom that otherwise would not be available.

Previous implementations of an amplifier which interfaces with a capacitive sensor have used an architecture which had a fixed output voltage regardless of the supply voltage, as it was level shifted up from the input DC voltage which sat at a fixed reference potential, such as ground. By scaling the input voltage with the power supply, an optimum DC point can be selected for the signal to pass through the amplifier with minimal distortion. In other words, clipping of the signal can be prevented. The configuration has minimal cost from the design perspective, as driving a DC voltage into the high impedance network at the amplifier interface can be done with a low power, low bandwidth auxiliary amplifier. The noise requirements for this auxiliary amplifier are relaxed due to the natural filtering created by the high impedance diodes and the capacitive sensor.

FIG. 1 shows a ratiometric biasing circuit 100 for a capacitive sensor in accordance with the present disclosure. The biasing circuit 100 includes a capacitive sensor element 102 connected to a preamplifier 104. The capacitive sensor element 102 is biased by a bias voltage HV POS from a positive charge pump. The ratiometric biasing of the output and/or other internal nodes of the preamplifier 104 which mates to the capacitive sensor 102 is achieved by driving the high impedance diodes 108 to a DC voltage relative to VDD, as shown in FIG. 1.

A feedback loop is proposed to create the ratiometric DC bias voltage, which consists of an auxiliary DC bias amplifier 106 in a negative feedback loop of the preamplifier 104. As seen in FIG. 1, the output of the preamplifier feeds an active low pass filter 106 with the DC reference for the active low pass filter being provided by the resistive divider 110.

The auxiliary amplifier 106 is a low bandwidth, low current amplifier which is used to supply a DC reference point to the high impedance diode network 108. As such, the current draw of this amplifier can be quite low, as the bandwidth requirement of this amplifier is that it can drive DC signals and nothing with higher frequency content. Ideally, this amplifier would only respond to changes in DC voltage at its input, so a dominant pole consisting of a miller compensated capacitor and high resistance is preferred to additionally limit this amplifier's bandwidth. Its noise requirements are also relaxed as the diode network, along with the capacitive sensor, form a filter to the amplifier input which greatly reduces in band noise generated by the auxiliary amplifier into the signal chain. Therefore, the proposed invention adds little additional current and no changes in performance, at the cost of additional area within the chip.

Figure 5:
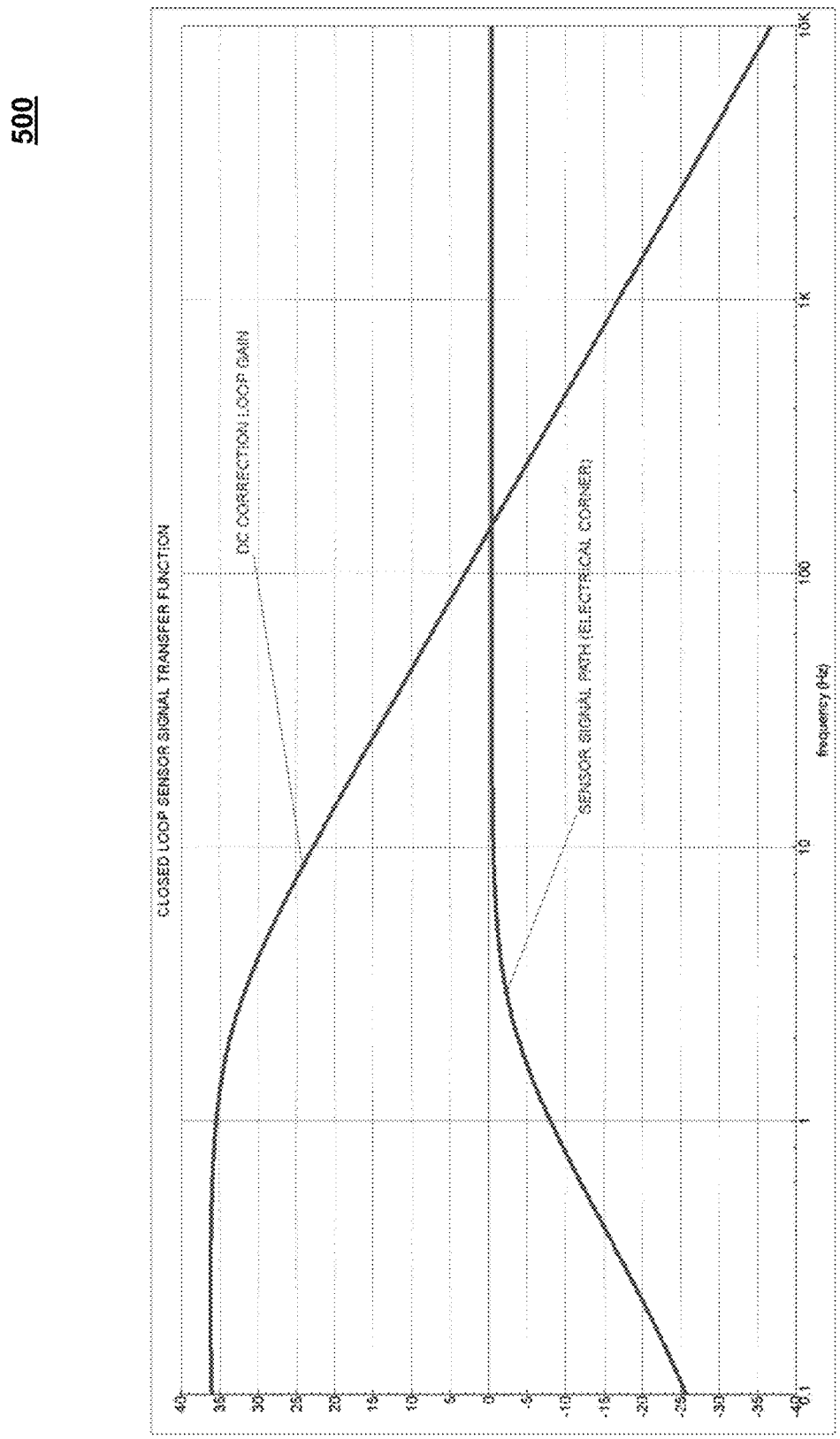
FIG. 5 shows a plot illustrating transfer functions of a ratiometric biasing circuit.

FIG. 5 shows a plot 500 illustrating transfer functions the DC correction loop and the sensor signal path. The natural filtering generated by the high impedance diode 108 network greatly relaxes the performance requirements of the auxiliary amplifier 106. The diodes 108 along with the capacitive sensor 102 generate a pole which lies very low in frequency, likely in the microHz region which allow the resistor and capacitor of 106 to be designed to set a dominant pole in the single digit Hz region, as shown in FIG. 5. As such, content passed on from the amplifier 106 will get filtered beginning at this pole frequency, and therefore content within the signal band is greatly reduced. This filtering allows the noise, PSRR, and other relevant performance metrics for the driving amplifiers to be relaxed and therefore these amplifiers can be relatively low performance with no performance impact.

The purpose of this amplifier 106 is to be placed in a feedback loop where it can sense the DC output voltage of the preamplifier 104, and adjust its output to keep the preamplifier DC output voltage fixed at a divided down supply voltage. The divided down supply voltage is provided to this auxiliary amplifier 106 as an input from a divider circuit, such as but not necessarily a resistive divider string. Using this reference voltage, the auxiliary amplifier 106 will sense the output of the preamplifier 104 and adjust its output to match the preamplifier output with the divider reference. The auxiliary amplifier 106 in feedback is particularly useful when noting that the capacitive sensor 102 may introduce some voltage offset to the diode network 108 and therefore may introduce some voltage offset to the preamplifier input voltage due to a leakage current, formed by some bridging impedance across the plates of the sensor. The auxiliary amplifier loop is able to adjust its output in the presence of this leakage current, such that the preamplifier output voltage is matched to the divided supply reference voltage.

As noted above, the output of the auxiliary amplifier 106 is fed to the positive input of the preamplifier 104 via a high impedance diode network 108. The high impedance diode network 108 conserves the charge stored on the capacitor at the sensor interface. In addition, the high impedance diode network 108 creates a DC reference point at the input of the preamplifier 104 based off of the DC voltage that is fed into it. As such, the auxiliary DC bias amplifier 106 provides a DC reference voltage to the diode network 108, which in turn sets the input DC bias at the amplifier-sensor interface. In the chosen preamplifier architecture, the input DC level also determines the amplifier output DC level through a level shift inside the amplifier. By directly controlling the input DC level, the output common mode can be changed to be optimally centered for signal swing. The proposed architecture may also be used to shift other internal modes inside the preamplifier 104 that are relative to the input DC level to maximize signal swing.

In operation, to initialize the circuit, a switch shorts the output of the auxiliary DC bias amplifier 106 directly to the input of the preamplifier 104 to initialize the input DC level of the preamplifier 104 during device startup. The initialization of the input DC level avoids the time constant that is associated with the diodes charging the capacitive load on the input via leakage currents.

Figure 2:
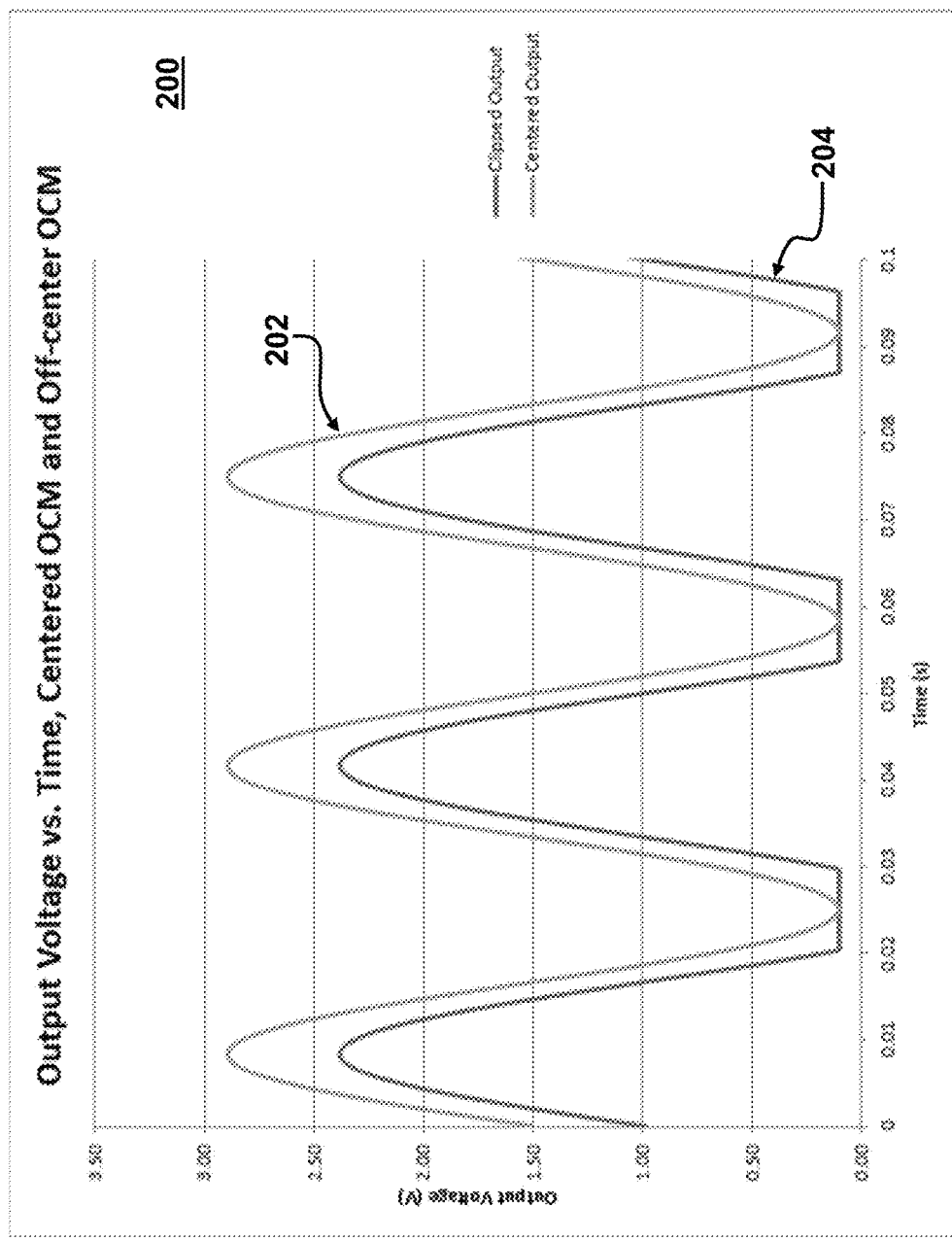
FIG. 2 shows a plot illustrating a sine wave centered at mid-rail and a sine wave centered below mid-rail.

The use of the auxiliary amplifier in the feedback loop to the preamplifier 104 enables the sensor signal at the output of the preamplifier 104 to have equal headroom both above and below this output voltage, such that one side of the signal does not begin to distort before the other. Biasing about the midpoint of the power supply rails maximizes the signal swing in both the positive and negative directions. FIG. 2 shows a plot 200 illustrating a sine wave 202 generated by the biasing circuit in accordance with the present disclosure and a sine wave 204 generated by a biasing circuit according to the prior art. As can be seen, the sine wave 202 is centered at mid-rail for the power supply, which in this case is a 3V power supply. The sine wave 204 is centered below mid-rail. As can be seen, the low-end of the off-center sine wave 204 begins to clip because it is limited in its swing range.

Figure 3:
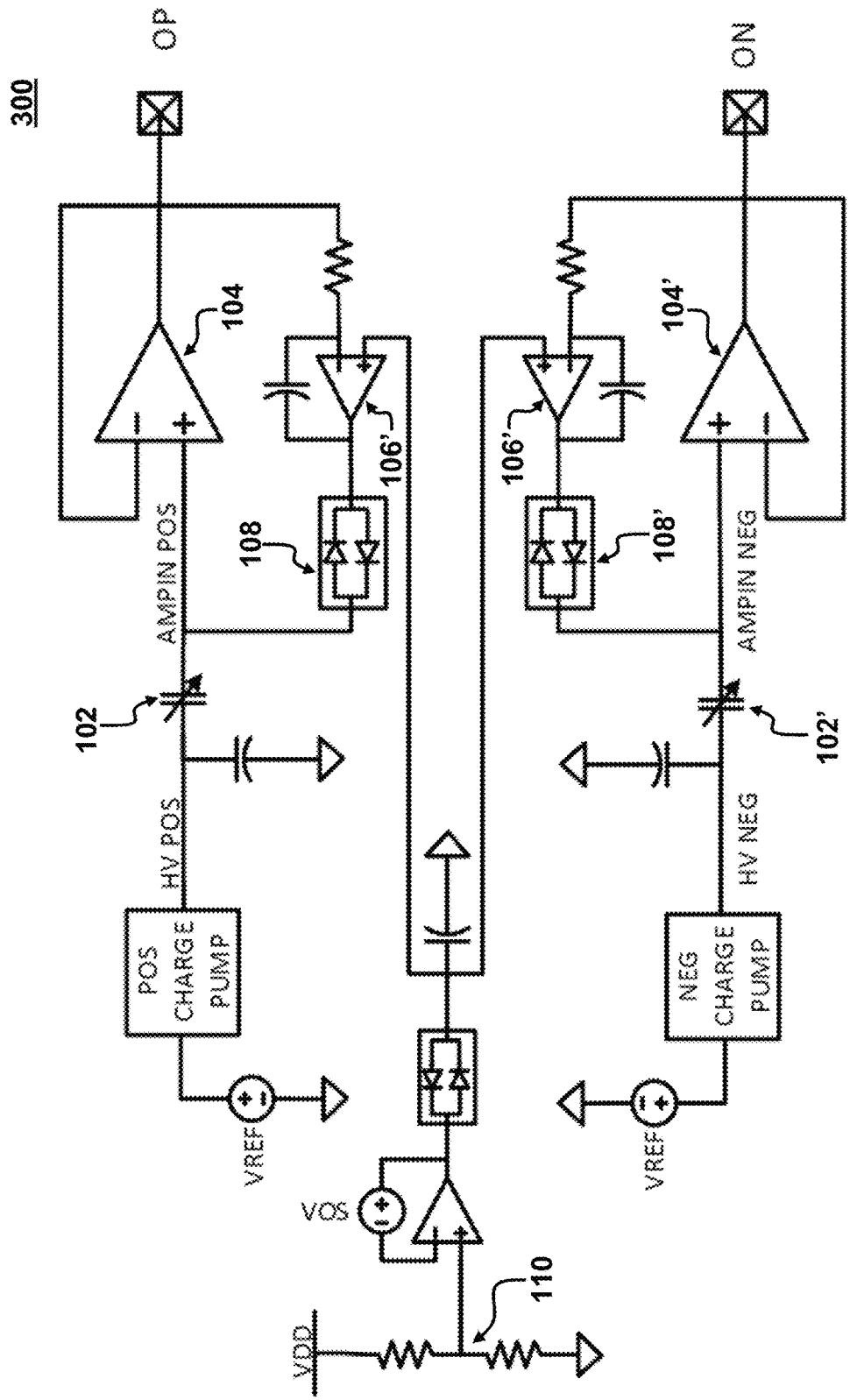
FIG. 3 shows a differential ratiometric biasing circuit for a differential capacitive sensor.

FIG. 3 depicts another embodiment of a biasing circuit in accordance with the present disclosure. The biasing circuit in FIG. 3 is a fully differential biasing circuit implementing ratiometric biasing, with two capacitive sensors 102, 102' biased at HV POS and HV NEG. The capacitive sensor elements 102, 102' each have a separate preamplifier 104, 104'. Each of the capacitive sensor elements 102, 102 are provided with a feedback loop with a respective auxiliary DC bias amplifier 106, 106' and a separate diode network 108, 108'. Each of the feedback loops is substantially the same as the feedback loop depicted in FIG. 1 except the polarity of the bias voltages used for the capacitive sensor elements 102, 102'.

As discussed above, in the embodiments shown, the auxiliary DC bias amplifier 106 is provided with the ratiometric reference voltage from an offset circuit (which can be in a feedback loop to generate a divided down supply voltage plus some fixed offset, such as VDD/2+100 mV), rather than directly from the voltage divider 110 as in the embodiment of FIG. 1.

Figure 4:
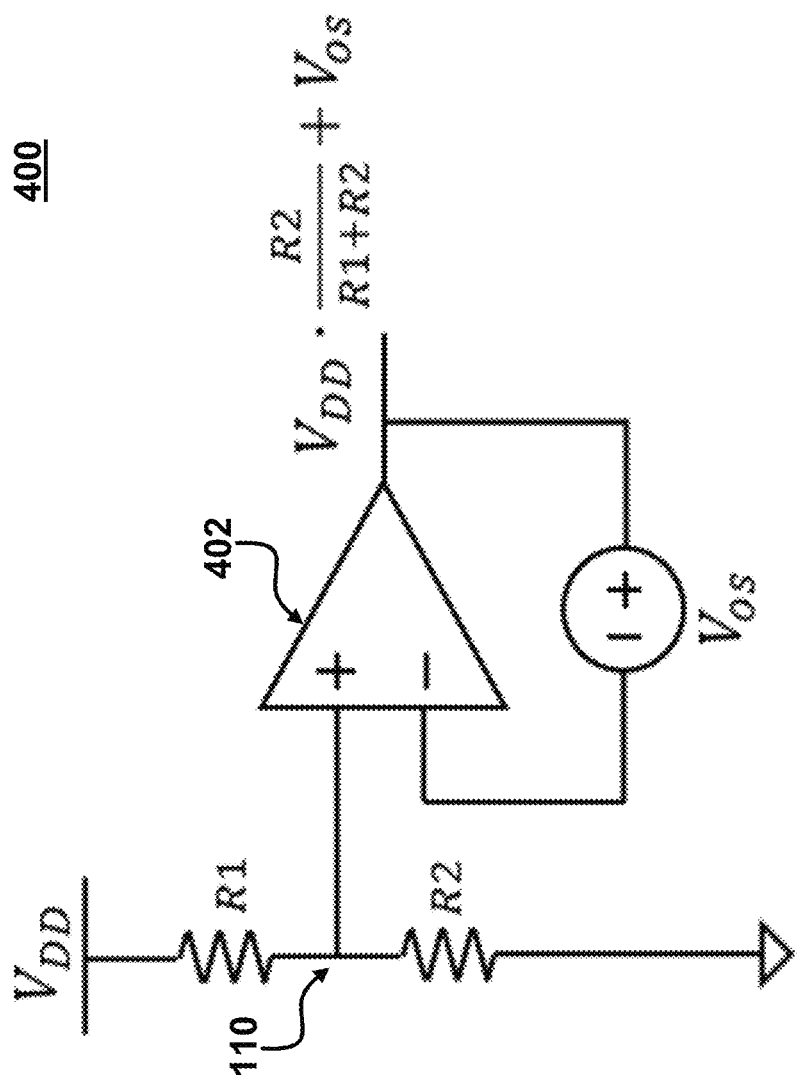
FIG. 4 shows a ratiometric offset amplifier circuit for providing a ratiometric voltage plus a static offset.

FIG. 4 shows a ratiometric offset amplifier circuit 400 for providing a ratiometric voltage plus a static offset. Particularly, the ratiometric offset amplifier circuit 400 includes a second auxiliary amplifier 402 which would be provided in a feedback loop of the auxiliary amplifier (e.g., 106, 106') which is configured to generate a bias point with a fixed offset relative to a ratiometric voltage. This additional loop may be used to set an optimal bias point around the output common mode voltage or other internally scaled voltage within the amplifier based on the available headroom. The positive terminal of the second auxiliary amplifier 402 is connected to the ratiometric supply voltage of the voltage divider 110. An offset voltage Vos is placed in the negative feedback of the second auxiliary amplifier 402 to add an additional level shift, generating a fixed offset that does not change with supply voltage VDD. The second auxiliary amplifier 402 can also be a low current amplifier with relatively relaxed noise requirements. Both auxiliary amplifiers' have noise that is low enough that the diode network's filtering removes any contribution from this new feedback loop before it reaches the signal chain.

Figure 6:
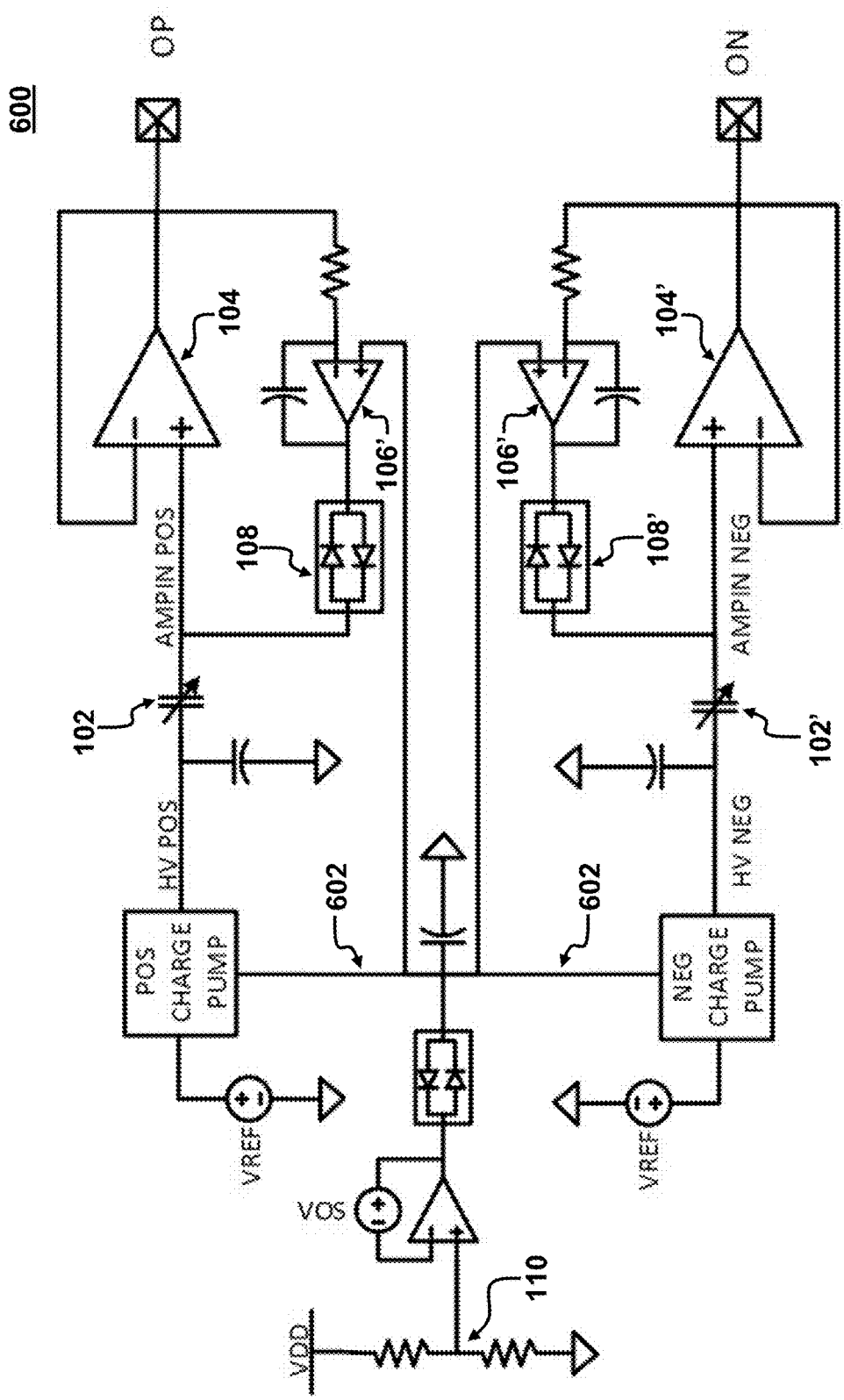
FIG. 6 shows a differential ratiometric biasing circuit having charge pump voltage correction.

Due to the ratiometric nature of the amplifier input DC voltage, the bias voltage across the capacitive sensor 102 would have a VDD dependence to it which would result in a power supply dependent sensitivity. As a consequence, the proposed biasing circuit may include an additional ratiometric sensor voltage, such that the capacitive sensor does not change sensitivity through the supply range for the device. An example of such as circuit is depicted in FIG. 6. In FIG. 6, the biasing circuit includes an additional ratiometric sensor voltage 602. This would then allow both terminals of the capacitive sensors 102, 102' to move in tandem with the supply voltage, and therefore the total voltage across the sensors 102, 102' would be constant regardless of the supply voltage. The charge pumps receive a ratiometric input voltage 602, which it could use to scale the bias voltage given to the sensors 102, 102'. The inclusion of this additional ratiometric voltage input is not essential for the proposed ratiometric biasing circuit to function, but would eliminate an undesired side-effect of the implementation.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A biasing circuit for a capacitive sensor, the biasing circuit comprising:
    a capacitive sensor element configured to produce a sensor voltage at a sense node;
    a preamplifier connected to the sense node and configured to amplify the sensor voltage; and
    an auxiliary amplifier connected between an output of the preamplifier and the sense node and configured to set a DC component of an input voltage for the preamplifier to a ratiometric DC bias voltage,
    wherein the auxiliary amplifier has a first input and a second input, the first input being connected to the output of the preamplifer, and
    wherein the second input receives a ratiometric reference voltage, wherein the ratiometric reference voltage is proportional to a power supply voltage of the biasing circuit while the power supply voltage changes.

2. The biasing circuit of claim 1, wherein the preamplifier is comprised of one or more stages, which are used to buffer or amplify an input signal.

3. The biasing circuit of claim 1, wherein the auxiliary amplifier is used to generate a ratiometric DC bias condition for an input of the preamplifier.

4. The biasing circuit of claim 1, wherein the biasing circuit further includes a high impedance diode network configured to generate a high impedance DC bias for the preamplifier.

5. The biasing circuit of claim 1, wherein the biasing circuit further includes a second auxiliary amplifier in a feedback loop of the auxiliary amplifier that generates a static offset voltage for the auxiliary amplifier.

6. The biasing circuit of claim 1, wherein the preamplifier generates an output voltage which is directly level shifted based on its input voltage.

7. The biasing circuit of claim 1, wherein the preamplifier has internal node voltages which are directly level shifted based on its input voltage.

8. A biasing circuit for a capacitive sensor, the biasing circuit comprising:
    a capacitive sensor element configured to produce a sensor voltage at a sense node;
    a preamplifier connected to the sense node and configured to amplify the sensor voltage;
    a feedback loop that branches off from an output of the preamplifier to a supply line between the sense node and an input of the preamplifier, the feedback loop including:
        an auxiliary amplifier configured to generate a ratiometric DC bias voltage, the auxiliary amplifier having a first input and a second input, the first input being connected to the output of the preamplifer, the second input receiving a ratiometric reference voltage, wherein the ratiometric reference voltage is proportional to a power supply voltage of the biasing circuit while the power supply voltage changes; and a high impedance diode network that receives the ratiometric DC bias voltage and sets an input DC bias voltage level for the preamplifier based on the ratiometric DC bias voltage.

9. The biasing circuit of claim 8, wherein the preamplifier is comprised of one or more stages, which are used to buffer or amplify an input signal.

10. The biasing circuit of claim 8, wherein the auxiliary amplifier includes a feedback loop, and wherein a second auxiliary amplifier is provided in a feedback loop of the auxiliary amplifier, the second auxiliary amplifier being configured to generates a static offset voltage for the auxiliary amplifier.

* * * * *